United States Patent
Kim et al.

(10) Patent No.: US 9,564,469 B2
(45) Date of Patent: Feb. 7, 2017

(54) IMAGE SENSOR COMPRISING A COLOR SEPARATION DEVICE SEPARATING INCIDENT LIGHT INTO PLURAL OF COLORS FOR HAVING IMPROVED LIGHT UTILIZATION EFFICIENCY AND METHOD OF MANUFACTURING THE SAME

(71) Applicant: SAMSUNG ELECTRONICS CO., LTD., Suwon-si (KR)

(72) Inventors: Ilhwan Kim, Yongin-si (KR); Sunghyun Nam, Yongin-si (KR); Doyoon KIM, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 140 days.

(21) Appl. No.: 14/640,418

(22) Filed: Mar. 6, 2015

(65) Prior Publication Data
US 2016/0054173 A1 Feb. 25, 2016

(30) Foreign Application Priority Data
Aug. 21, 2014 (KR) .................. 10-2014-0109047

(51) Int. Cl.
| | |
|---|---|
| H01L 27/146 | (2006.01) |
| G01J 3/51 | (2006.01) |
| G01J 3/02 | (2006.01) |
| G01J 3/14 | (2006.01) |
| G01J 3/18 | (2006.01) |

(52) U.S. Cl.
CPC ........ *H01L 27/14685* (2013.01); *G01J 3/0205* (2013.01); *G01J 3/0208* (2013.01); *G01J 3/0259* (2013.01); *G01J 3/0262* (2013.01); *G01J 3/14* (2013.01); *G01J 3/18* (2013.01); *G01J 3/513* (2013.01); *H01L 27/14621* (2013.01); *H01L 27/14625* (2013.01); *H01L 27/14627* (2013.01); *H01L 27/14629* (2013.01)

(58) Field of Classification Search
CPC .................. H01L 27/14621; H01L 27/14645; H01L 27/14685; H04N 5/2254; H04N 1/482; G01J 1/0492; G01J 3/51; G01J 1/0422; G01J 3/0262
USPC ..... 250/208.1, 226, 216, 239; 257/440–444; 348/298–311
See application file for complete search history.

(56) References Cited

U.S. PATENT DOCUMENTS

| | | | |
|---|---|---|---|
| 8,035,144 B2 | 10/2011 | Fereyre | |
| 8,063,352 B2 * | 11/2011 | Blayvas | G01J 3/02 250/208.1 |
| 2013/0293751 A1 | 11/2013 | Vaartstra et al. | |

FOREIGN PATENT DOCUMENTS

| | | |
|---|---|---|
| KR | 10-2007-0029921 A | 3/2007 |
| KR | 2009-111225 A | 5/2009 |
| KR | 10-2014-0041548 A | 4/2014 |

(Continued)

*Primary Examiner* — Que T Le
(74) *Attorney, Agent, or Firm* — Sughrue Mion, PLLC

(57) ABSTRACT

An image sensor including a color filter array layer, which includes a plurality of color filters transmitting light of different colors; and reflective partitioning walls, which define the color filters and have a lower refractive index than that of the color filters; a color separation device, which separates incident light into a plurality of colors, such that the plurality colors are incident on the plurality of color filters, respectively; and a sensor substrate, on which a plurality of light detection devices for respectively sensing light transmitted through the plurality of color filters are arranged in an array shape.

20 Claims, 14 Drawing Sheets

(56) References Cited

FOREIGN PATENT DOCUMENTS

KR 2014-86742 A 5/2014

* cited by examiner

IMAGE SENSOR COMPRISING A COLOR SEPARATION DEVICE SEPARATING INCIDENT LIGHT INTO PLURAL OF COLORS FOR HAVING IMPROVED LIGHT UTILIZATION EFFICIENCY AND METHOD OF MANUFACTURING THE SAME

RELATED APPLICATION

This application claims priority from Korean Patent Application No. 10-2014-0109047, filed on Aug. 21, 2014, in the Korean Intellectual Property Office, the disclosure of which is incorporated herein in its entirety by reference.

BACKGROUND

1. Field

Apparatuses and methods consistent with exemplary embodiments relate to image sensors having improved light utilization efficiency and methods of manufacturing the same 2. Description of the Related Art Color display apparatuses and color image sensors, respectively, display images of various colors and detect the color of incident light. Currently available color display apparatuses and color image sensors generally employ a red, green, and blue (RGB) color filter structure in which, for example, two green filters are arranged in two out of every four pixels and a blue filter and a red filter are arranged in the other two of every four pixels. Alternately, a cyan, yellow, green, and magenta (CYGM) color filter structure may be used in which each four pixels include one pixel each of cyan, yellow, green, and magenta color filters.

However, since a typical absorption-type color filter absorbs light of colors other than the corresponding filter color, the light utilization efficiency thereof is low. For example, in the case of an RGB color filter, the RGB color filter transmits only one-third of the light incident thereon and absorbs the remaining two-thirds of the incident light, and thus, the light utilization efficiency of an RGB color filter is only about 33%. Therefore, in the case of a color display apparatus or a color image sensor, most of the light loss occurs in the color filter.

Meanwhile, as the number of pixels of a color image sensor has increased, the size of the pixels has decreased. Therefore, the amount of a light reaching each pixel has decreased, and thus, a method of improving the light utilization efficiency of an image sensor has become very important.

Recently, to improve the light utilization efficiency of a color display apparatus or a color image sensor, use of a color separation device, together with a color filter has been attempted. A color separation device separates incident light into different colors according to the diffraction and/or refraction properties of the device which vary according to wavelength. Light, thus separated into colors, is then transmitted to corresponding pixels. Thus, light of a non-corresponding color is refracted and/or diffracted away from the respective color filter of a pixel of a and is, instead, transmitted to an adjacent pixel of a corresponding color. Thus, the overall efficiency of a color display apparatus or color image sensor including the color separation device may be improved.

However, when light separated by a color separation device is incident on a color filter, some of the incident light may not be vertically incident on the color filter and, rather, may be incident on the color filter at a tilted angle, according to wavelength. Due to such a tilted angle of incidence, when the light is transmitted through the color filter and reaches a sensor array, the light may be incident on a sensor array corresponding to an adjacent pixel, rather than on a sensor array corresponding to the proper pixel. Thus, the light utilization efficiency of a color display apparatus or color image sensor including the color separation device is decreased and cross-talk between adjacent pixels is increased.

SUMMARY

One or more exemplary embodiments may provide image sensors with improved light utilization efficiency, and more particularly, image sensors having a structure for improving the use efficiency of lights separated by a color separation device to be incident onto corresponding pixels.

Additional exemplary aspects and advantages will be set forth in part in the description which follows and, in part, will be apparent from the description, or may be learned by practice of the presented embodiments.

According to an aspect of an exemplary embodiment, an image sensor includes a color filter array layer, which includes a plurality of color filters, which transmit light of different colors; and reflective partitioning walls, which define the color filters and are formed of a material with a lower refractive index than that of the color filters; a color separation device, which separates incident light into a plurality of colors, such that the plurality of colors are incident onto the plurality of color filters, respectively; and a sensor substrate, on which a plurality of light detection devices for respectively sensing light transmitted through the plurality of color filters are arranged in an array shape.

When refractive index of the color filter is n1, a refractive index n2 of the reflective partitioning walls may satisfy the below condition:

$$n2 < n1 \cos \theta,$$

where, $\theta$ is a largest angle of incidence at which the plurality of colors, separated by the color separation device, are incident onto the color filters.

When a refractive index of the color filter is n1, a refractive index n2 of the reflective partitioning walls may satisfy the below condition:

$$n2 < n1 \cos \phi,$$

where, $\phi$ is a largest angle formed between a line interconnecting a center of a light emission surface of the color separation device and a center of the reflective partitioning walls and a line normal to light emission surfaces of the color filters.

The reflective partitioning walls may be formed of polymethylmetacrylate (PMMA), silicon acrylate, cellulose acetate butyrate (CAB), silicon oxide ($SiO_2$), siloxane-based spin-on-glass (SOG), fluoro-silicon acrylate (FSA), or silicon nitride ($SiN_x$).

The image sensor may further include a micro-lens for concentrating a light to the color separation device.

The image sensor may further include a transparent spacer layer, which is arranged on the color filter array layer, wherein the color separation device is buried and fixed within the transparent spacer layer.

The sensor substrate may further include partitioning walls, which define the plurality of light detection devices and are formed of a material that absorbs or reflects light.

The plurality of color filters may include a plurality of first color filters, which transmit a light of a first color; a plurality of second color filters, which transmit a light of a second color; and a plurality of third color filters, which transmit a light of a third color, wherein the first through third color filters are alternately and two-dimensionally arranged, such that each of the color filters is adjacent to color filters of different colors.

The color separation device may emit light of the first color toward the first color filter, emit light of the second color toward the second color filter, and emit light of the third color toward the third color filter.

The color separation device may emit light of the second color toward the second color filter and emit light of both the first color and the third color, toward the first color filter and the third color filter.

When a refractive index of the color filter is n1, a refractive index n2 of the reflective partitioning walls may satisfy the below condition:

$$n2 < n1 \cos \theta,$$

where, θ is an angle of incidence at which mixed light of both the first color and the third color, is incident onto the color filters.

When a refractive index of the color filter is n1, a refractive index n2 of the reflective partitioning walls may satisfy the below condition:

$$n2 < n1 \cos \phi,$$

where, φ is an angle formed between a line interconnecting a center of a light emission surface of the color separation device and a center of the reflective partitioning walls and a line normal to a light emission surface of the first color filter.

The plurality of second color filters and the plurality of third color filters may be alternately arranged along a first row in a first direction, the plurality of first color filters and the plurality of second color filters may be alternately arranged along a second row parallel to the first row, and the first row and the second row may be alternately arranged in a second direction, which is perpendicular to the first direction.

The color separation device may include a first color separation device, which is arranged to face the second color filter of the first row, emits light of the third color toward the third color filter, and emits a light of the second color toward the second color filter; and a second color separation device, which is arranged to face the second color filter of the second row, emits light of the second color toward the second color filter, and emits light of the first color toward the first color filter.

The color separation device may be arranged to face the second color filter of the first row or the second row, emits light of the second color toward the second color filter, and emits mixed light of both the first color and the third color, toward the first and third color filters.

According to an aspect another exemplary embodiment, an image pickup apparatus includes an image pickup lens unit, which forms an optical image from a light reflected by an object; and the image sensor of claim 1, which converts the optical image formed by the image pickup lens unit into electric signals.

According to an aspect of another exemplary embodiment, a method of manufacturing an image sensor, the method includes providing a sensor substrate, on which a plurality of light detection devices for respectively sensing light transmitted through a plurality of color filters are arranged in an array; forming reflective partitioning walls, which define a plurality of areas, arranged in a two-dimensional array, on the sensor substrate; forming a plurality of color filters, which transmit light of different colors, on the plurality of areas; and forming a color separation device, which separates incident light into the plurality of colors, such that the plurality of colors are incident onto the plurality of color filters, respectively.

The forming of the reflective partitioning walls may include forming a material layer having lower refractive index than the color filters on the sensor substrate; forming a photoresist layer on the material layer and patterning the photoresist layer into a shape corresponding to the desired reflective partitioning walls; and etching the material layer by using the patterned photoresist layer as a mask and removing the patterned photoresist layer.

The forming of the reflective partitioning walls may include forming a photoresist layer on the sensor substrate and patterning the photoresist layer to engrave a shape corresponding to the desired reflective partitioning walls; forming a material layer completely covering the engraved area of the photoresist layer; etching the material layer to expose a top surface of the photoresist layer; and removing the photoresist layer.

The color separation device may be formed on the plurality of color filters and buried and fixed within a transparent spacer layer.

BRIEF DESCRIPTION OF THE DRAWINGS

These and/or other exemplary aspects and advantages will become apparent and more readily appreciated from the following description of exemplary embodiments, taken in conjunction with the accompanying drawings in which.

DETAILED DESCRIPTION

Figure 1:
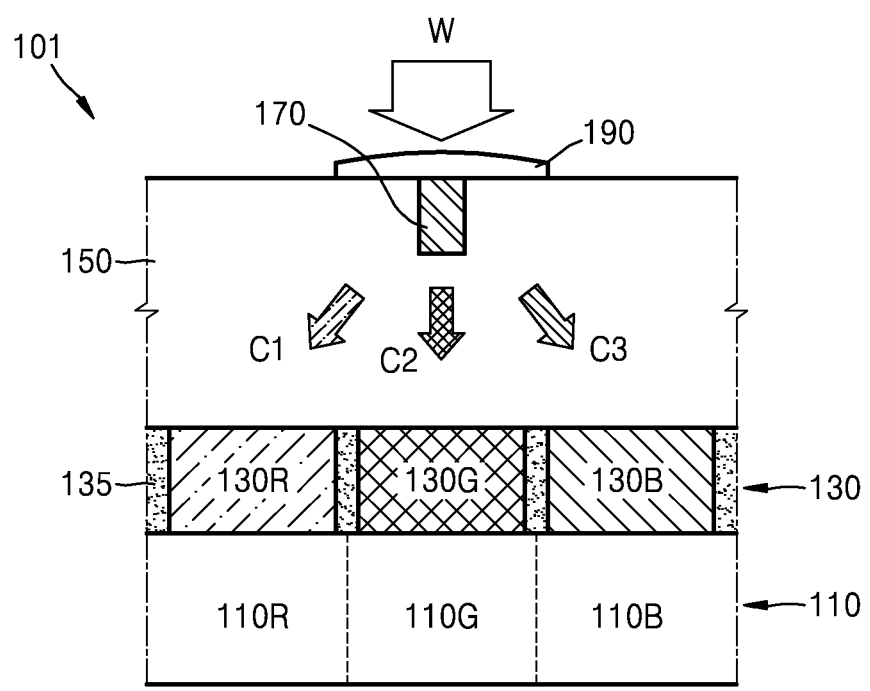
FIG. 1 is a schematic sectional diagram showing the structure of an image sensor according to an exemplary embodiment.

Various changes and numerous exemplary embodiments are conceived, and particular exemplary embodiments will be illustrated in the drawings and described in detail in the written description. However, the detailed description is not intended to be limiting, and it is to be appreciated that all changes, equivalents, and substitutes that do not depart from the spirit and technical scope of the described exemplary embodiments may be made.

Reference will now be made in detail to exemplary embodiments which are illustrated in the accompanying drawings, wherein like reference numerals refer to like elements throughout, and descriptions thereof will not be repeated.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation. In other words, since the sizes and thicknesses of components in the drawings are arbitrarily illustrated for convenience of explanation, the following exemplary embodiments are not limited thereto.

When a certain embodiment may be implemented differently, a specific process order may be performed differently from the described order. For example, two consecutively described processes may be performed substantially at the same time or performed in an order opposite to the described order.

Figure 2A:
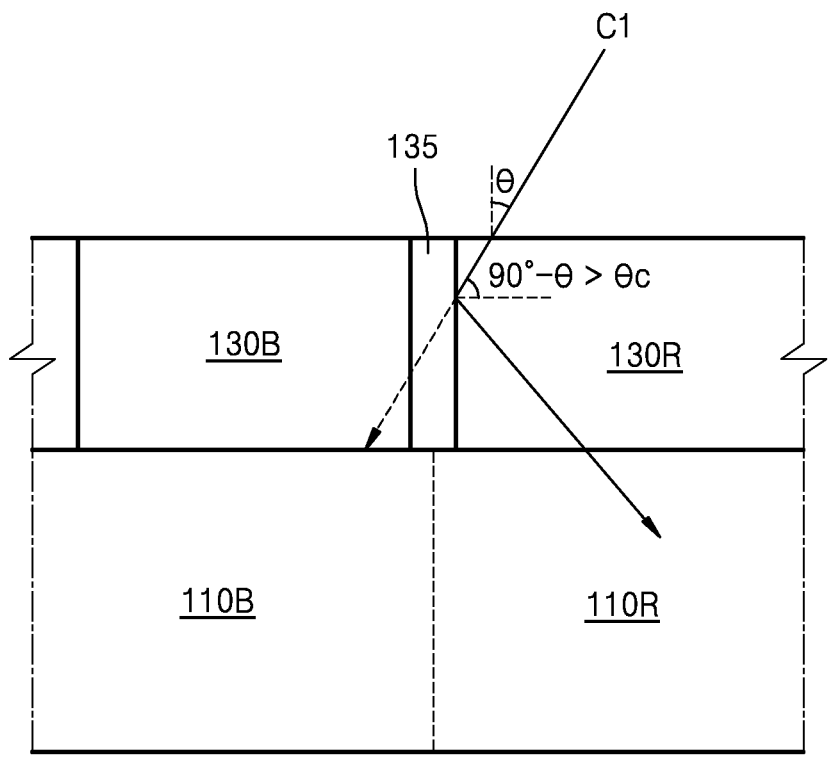
FIGS. 2A and 2B are diagrams illustrating refractive index conditions for improving light utilization efficiency via reflective partitioning walls arranged in the image sensor of FIG. 1.
Figure 2B:
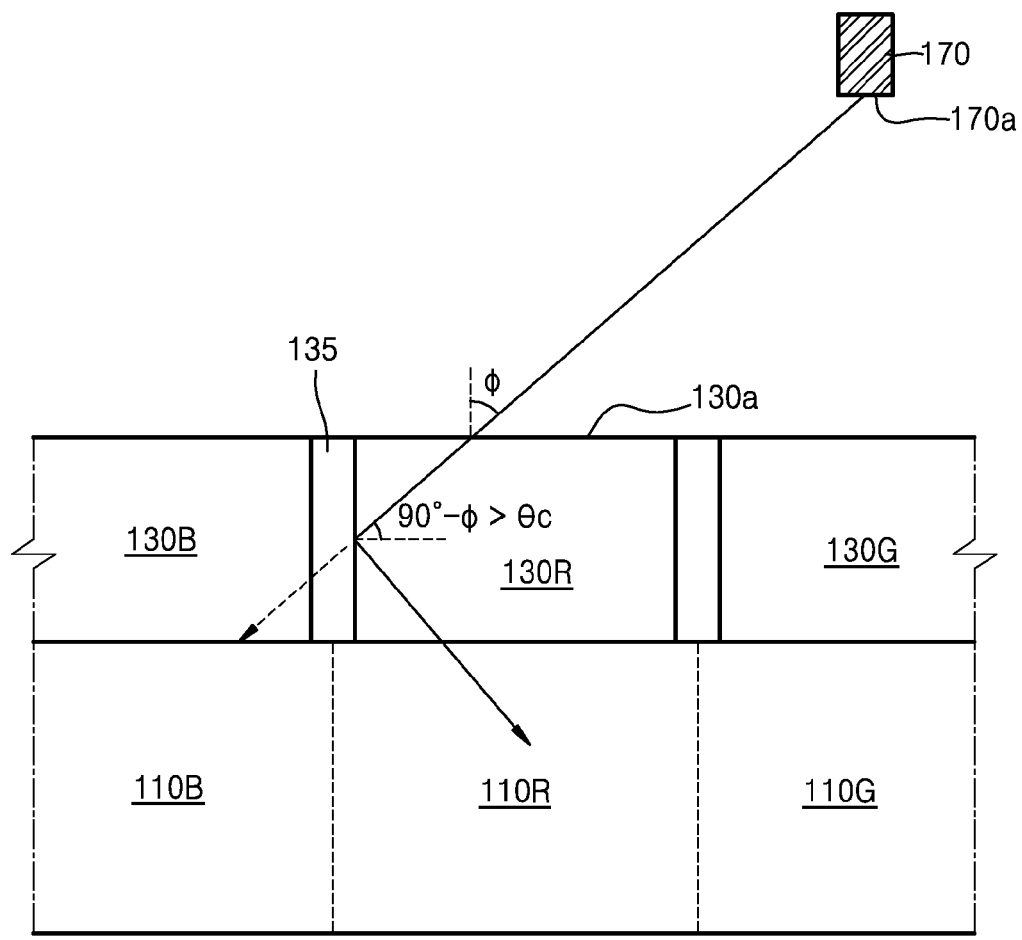

FIG. 1 is a schematic sectional diagram showing the structure of an image sensor 101 according to an exemplary embodiment, and FIGS. 2A and 2B are diagrams for describing refractive index conditions for improving light utilization efficiency via reflective partitioning walls 135 arranged in the image sensor 101 of FIG. 1.

The image sensor 101 includes a sensor substrate 110 including an array of a plurality of light detection devices 110R, 110G, and 110B for sensing light, a color filter array layer 130, which is formed on the sensor substrate 110 and includes a plurality of color filters 130R, 130G, and 130B for transmitting light of different colors, and a color separation device 170, which separates incident light into a plurality of colors to be respectively incident onto the plurality of color filters 130R, 130G, and 130B.

Furthermore, the color filter array layer 130 includes reflective partitioning walls 135 which define the color filters 130R, 130G, and 130B. The reflective partitioning walls 135 are formed of a material having a refractive index smaller than that of any of the color filters 130R, 130G, and 130B. Thus, light is totally internally reflected within the color filters 130R, 130G, and 130B.

The image sensor 101 may further include a transparent spacer layer 150, within which the color separation device 170 is buried and fixed.

The image sensor 101 according to the present exemplary embodiment includes both the color separation device 170 and the plurality of color filters 130R, 130G, and 130B to improve light utilization efficiency and also includes the reflective partitioning walls 135. Thus, the incident light is separated into of different wavelengths/colors by the color separation device 170, and the light of different colors is respectively incident onto corresponding pixels and is not incident onto other, non-corresponding, pixels.

For convenience of explanation, FIG. 1 shows only one color separation device 170, one first color filter 130R, one second color filter 130G, one third color filter 130B, and first through third light detection devices 110R, 110G, and 110B, respectively facing the first through third color filters 130R, 130G, and 130B. However, these components are repeatedly arranged in the image sensor 101 a number of times corresponding to a desired number of pixels. This same arrangement applies to the other exemplary embodiments, as well.

Components constituting the image sensor 101 will be described below in closer details.

The sensor substrate 110 includes the plurality of light detection devices 110R, 110G, and 110B, which detect light and generate electric signals. The plurality of light detection devices 110R, 110G, and 110B correspond to the plurality of color filters 130R, 130G, and 130B, respectively. For example, the first light detection device 110R is arranged to face the first color filter 130R and detects light transmitted through the first color filter 130R; the second light detection device 110G is arranged to face the second color filter 130G and detects light transmitted through the second color filter 130G; and the third light detection device 110B is arranged to face the third color filter 130B and detects light transmitted through the third color filter 130B. Each of the first through third light detection devices 110R, 110G, and 110B is independently driven and generates an electric signal of a magnitude corresponding to an intensity of light incident thereon. The first through third light detection devices 110R, 110G, and 110B may include, for example, charge-coupled device (CCD) sensors or complementary metal-oxide semiconductor (CMOS) sensors and may be arranged in the shape of a 2-dimensional matrix having a plurality of rows and a plurality of columns.

The color separation device 170 separates incident light into different colors, so that light of different wavelength bands propagates along in different paths. The color separation device 170 may separate incident light into colors by changing the light propagation paths based on wavelength using diffraction properties or refraction properties that vary by wavelength. For example, various forms of the color separation device 170 are known in the art, such as a transparent symmetric or asymmetric rod-like or a prism-like waveguide device having tilted surfaces, and any of various designs may be employed based on the desired spectrum distribution of emitted light. For example, as shown in FIG. 1, the color separation device 170 may be arranged opposite the second color filter 130G, which transmits green light. In this case, the color separation device 170 may be configured to transmit light of a second color C2 toward the second color filter 130G, just below the color separation device 170; to diffract or refract light of a first color C1 toward the first color filter 130R, on the left; and to diffract or refract light of a third color C3 toward the third color filter 130B, on the right.

The color separation device 170 may be buried and fixed within the transparent spacer layer 150. For sufficient diffraction and refraction of incident light, the color separation device 170 may be formed of a material having a higher refractive index than that of the surroundings transparent spacer layer 150. In other words, refractive index of the color separation device 170 may be greater than that of the transparent spacer layer 150. For example, the transparent spacer layer 150 may be formed of silicon oxide ($SiO_2$) or siloxane-based spin-on-glass (SOG), whereas the color separation device 170 may be formed of a material with high refractive index, e.g., $TiO_2$, $SiN_3$, ZnS, ZnSe, $Si_3N_4$, etc. The shape of the color separation device 170 and the material of which it is made may vary according to desired color separating properties thereof.

By using the color separation device 170, an amount of light transmitted through the first color filter 130R, the second color filter 130G, and the third color filter 130B increases, and thus the light utilization efficiency of an image sensor may be improved.

The color filter array layer 130 includes the first color filter 130R transmitting a light of the first color, the second color filter 130G transmitting a light of the second color, and the third color filter 130B transmitting a light of the third color, and the reflective partitioning walls 135 optically isolating the first through third color filters 130R, 130G, and 130B from one another. The plurality of color filters 130R, 130G, and 130B may be arranged in the shape of a 2-dimensional matrix having a plurality of rows and a plurality of columns. The color filters 130R, 130G, and 130B may be arranged in any of various shapes in which different color filters are alternated according to a designated pattern, that is, color filters of different colors may be adjacent to one another. For example, a first color, a second color, and a third color may be red, green, and blue, respectively. However, exemplary embodiments are not limited thereto. For example, the color filter array layer 130 may include color filters corresponding to cyan, yellow, green, and magenta. Alternatively, if desired, filters having transmitting properties with respect to other wavelength bands including, but not limited to, an infrared ray band and an ultraviolet ray band, may be used.

The reflective partitioning walls 135 may be arranged between the plurality of first through third color filters 130R, 130G, and 130B and optically isolate the first through third color filters 130R, 130G, and 130B, respectively, from adjacent color filters. In other words, due to the use of the reflective partitioning walls 135, when light is incident on any one of the color filters 130R, 130G, and 130B, even if the light is incident at a tilted angle, the light is not transmitted into an adjacent pixel. Accordingly, the reflective partitioning walls 135 may be formed of a material having a refractive index lower than that of any of the first through third color filters 130R, 130G, and 130B. For example, the reflective partitioning walls 135 may be formed of polymethylmetacrylate (PMMA), silicon acrylate, cellulose acetate butyrate (CAB), silicon oxide ($SiO_2$), siloxane-based spin-on-glass (SOG), fluoro-silicon acrylate (FSA), silicon nitride ($SiN_x$), etc. The reflective partitioning walls 135 may be formed of any of various materials as long as the material satisfies a designated refractive index for totally reflecting incident light. Particularly, the reflective partitioning walls 135 may be formed of a material that may be formed via a physical vapor deposition (PVD) process or a chemical vapor deposition (CVD) process, as used in common semiconductor manufacturing. The designated refractive index may be determined based on a relationship between refractive indexes of the color filters 130R, 130G, and 130B and an angle of incidence at which light, separated by the color separation device 170, is incident on the color filters 130R, 130G, and 130B. A detailed descriptions thereof will be given below with reference to FIGS. 2A and 2B.

The reflective partitioning walls 135 totally reflects light that is incident onto light incident surfaces of the color filters 130R, 130G, and 130B at titled angles and is directed to side surfaces of the color filters 130R, 130G, and 130B, thereby optically isolating the color filters 130R, 130G, and 130B from adjacent color filters.

For example, when incident light is separated by the color separation device 170, light of the second color C2 may be incident to the second color filter 130G almost perpendicularly as shown in FIG. 1, and thus very little light is lost due to incidence of light of the second color C2 on the first color filter 130R or the third color filter 130B. However, light of the first color C1 and light of the third color C3, diffracted or refracted toward the left and right, are incident onto the first color filter 130R and the third color filter 130B, respectively, at titled angels, that is, angles of incidence greater than 0. Therefore, if the reflective partitioning walls 135 are not used, light of the first color C1 and light of the third color C3 may be transmitted into an adjacent color filter, thereby causing light loss or crosstalk.

Referring to FIG. 2A, light of the first color C1, which is incident on the first color filter 130R at an angle of incidence θ, is incident on the reflective partitioning walls 135 at an angle of incidence 90°-θ. For total reflection to occur at the boundary between the first color filter 130R and the reflective partitioning walls 135, it is necessary for the angle of incidence 90°-θ to be greater than a critical angle θc for total reflection. In other words, it is necessary to satisfy the following condition.

$$90°-\theta > \sin^{-1}(n2/n1)$$

$$n2 < n1 \cos\theta$$

Here, n1 is the refractive index of the first color filter 130R, and n2 is the refractive index of the reflective partitioning walls 135.

Although, it is noted that the case in which light of the first color C1, separated by the color separation device 170, is incident onto a color filter at a titled angle, it is merely an example. An angle of incidence θ, discussed above, may be the largest one from among angles of incidence of light separated by the color separation device 170 and incident on any of the plurality of color filters 130R, 130G, and 130B. For example, if an angle of incidence at which light of the third color C3 is incident on the third color filter 130B is greater than an angle of incidence at which light of the first color C1 is incident on the first color filter 130R, a refractive index of the reflective partitioning walls 135 may be determined based on the angle of incidence at which light of the third color C3 is incident on the third color filter 130B.

When the reflective partitioning walls 135 satisfy the refractive index condition as described above, incident light of the first color C1 is totally reflected by the reflective partitioning walls 135. Therefore, light of the first color C1 is not transmitted into the third color filter 130B, is instead transmitted through the first color filter 130R, and is incident on the first light detection device 110R. In other words, light of the first color C1 incident on the first color filter 130R is incident on the first light detection device 110R without loss and contributes to the generation of electric signals.

The arrow indicated with a dotted line in FIG. 2A indicates a case in which the reflective partitioning walls 135 are not used. In this case, as shown, light of the first color C1 is transmitted through the color filter 130B and is incident on the adjacent third color filter 130B. Here, since the third color filter 130B is a filter that transmits light of the third color C3 and absorbs light of other colors, light of the first color C1 is absorbed by the third color filter 130B. Thus, in order for light of the first color C1 to contribute to the acquisition of color information, it must be transmitted through the first color filter 130R, and incident to the first light detection device 110R. However, in the case in which the reflective partitioning walls 135 are not used, the light of the first color C1 is absorbed by the third color filter 130B, and correct color information is not be obtained. Furthermore, the third color filter 130B does not absorb 100% of light of other colors, and some of the light of other colors is incident on the third light detection device 110B. As a result, incorrect color information may be obtained, thereby causing crosstalk.

FIG. 2B is a diagram showing another method of determining the refractive index condition.

Referring to FIG. 2B, the refractive index of the reflective partitioning walls 135 may be determined as shown based on the largest one from among angles formed between a line interconnecting a center of a light emission surface 170a of the color separation device 170 and a center of the reflective partitioning walls 135 and lines normal to light incident surfaces of the first through third color filters 130R, 130G, and 130B.

$$90°-\phi > \sin-1(n2/n1)$$

$$n2 < n1 \cos \phi$$

In FIG. 2B, an angle $\phi$ is shown as an angle formed between the center of the light emission surface 170a of the color separation device 170 and the center of the reflective partitioning walls 135 and a line normal to a light incident surface 130a of the first color filter 130R. However, this is merely an example. The angle $\phi$ may also be determined based on a relationship with lines normal to a light incident surface of the second color filter 130G or a light incident surface of the third color filter 130B.

The reason for using an angle $\phi$ for determining the refractive index of the reflective partitioning walls 135 as described above is that the color separation device 170 may be designed, such that an angle of incidence of light of the first color C1, diffracted or refracted by the color separation device 170 and incident on the first color filter 130R at a tilted angle, becomes identical or similar to $\phi$.

Angles of incidence of light of the first color C1, diffracted or refracted by the color separation device 170 and incident on the first color filter 130R at a tilted angle, are not constant and may have some distribution. Thus, the refractive index of the reflective partitioning walls 135 may be determined based on an angle that may be the median of the distribution of the angles of incidence, such that light may be totally reflected by the reflective partitioning walls 135 as much as possible.

Figure 3:
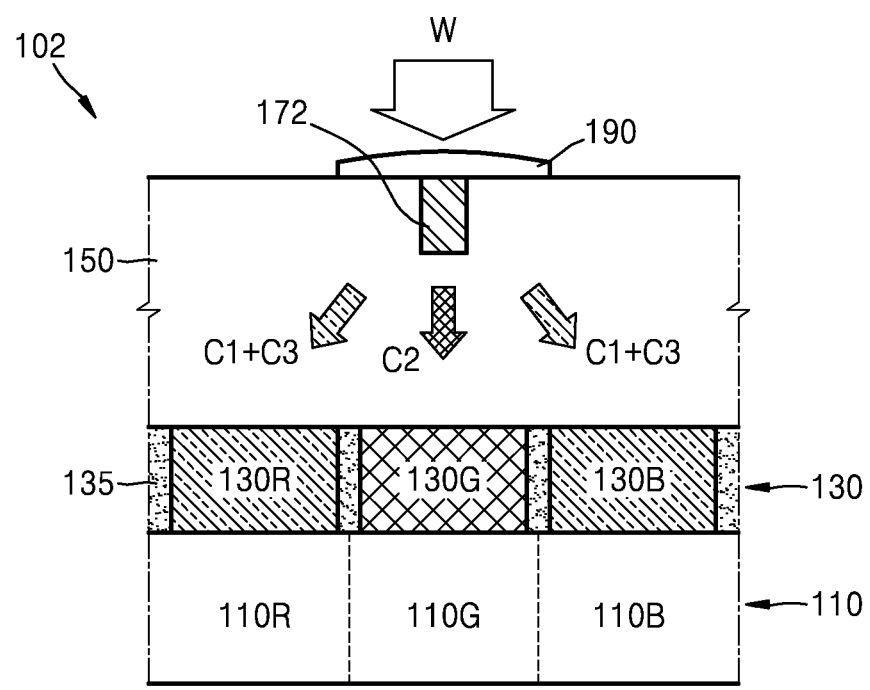
FIG. 3 is a schematic sectional view showing the structure of an image sensor according to another exemplary embodiment.
Figure 4:
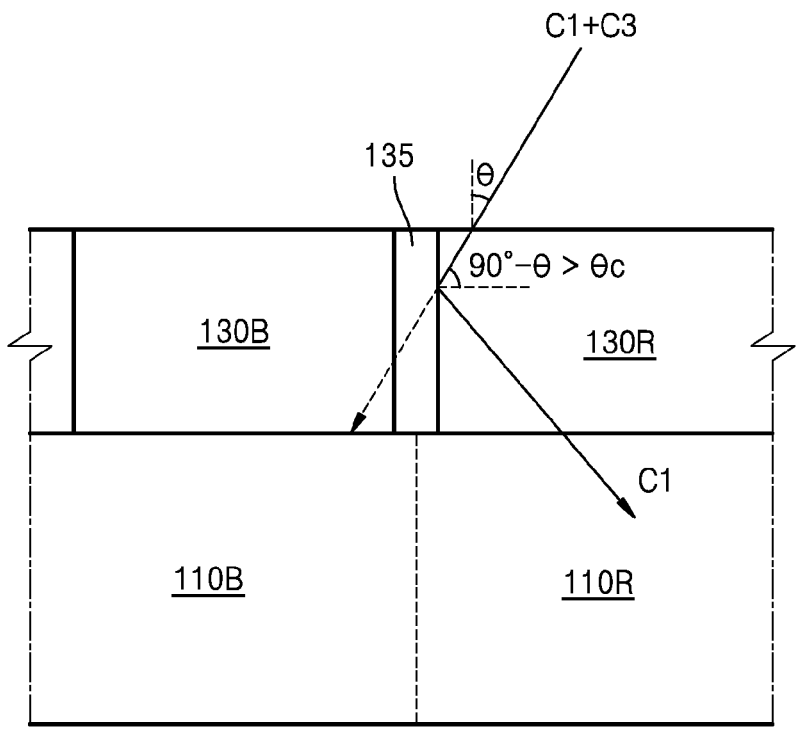
FIG. 4 is a diagram showing a light path that improves light utilization efficiency based on the reflective partitioning walls arranged in the image sensor of FIG. 3.

FIG. 3 is a schematic sectional view showing the structure of an image sensor 102 according to another exemplary embodiment, and FIG. 4 is a diagram showing a light path that improves light utilization efficiency based on the reflective partitioning walls 135 arranged in the image sensor 102 of FIG. 3.

Configuration of the image sensor 102 according to the present exemplary embodiment is identical to that of the image sensor 101 of FIG. 1, except for the function of a color separation device 172.

The color separation device 172 may be configured to emit light of the second color C2 toward the second color filter 130G just below the color separation device 170 and to diffract or refract mixed light C1+C3, which is a mixture of light of the first color C1 and light of the third color C3, to the left and to the right toward the first color filter 130R and the third color filter 130B.

When the mixed light C1+C3 is incident on the first color filter 130R, the first color filter 130R transmits the light of the first color C1 and absorbs the other light. Therefore, the light of the first color C1 is transmitted through the first color filter 130R and is incident on the first light detection device 110R. Furthermore, at the third color filter 130B, the light of the third color C3 from the mixed light C1+C3 is transmitted through the third color filter 130B and is incident on the third color filter 130B.

Since the light of the second color C2, transmitted by the color separation device 172, is incident on the third color filter 130B almost perpendicularly, it is not likely that the light of the second color C2 is incident on other adjacent color filters even if the reflective partitioning walls 135 are not used. However, the mixed light C1+C3, traveling toward the first color filter 130R and the third color filter 130B respectively arranged at the left and at the right of the color separation device 172, is incident on the first color filter 130R and on the third color filter 130B at tilted angles. Therefore, if the reflective partitioning walls 135 are not used, the mixed light C1+C3 is transmitted through to third color filter 130B and the first color filter 103R, and is incident on adjacent color filters (not shown).

Referring to FIG. 4, the mixed light C1+C3 incident on the first color filter 130R at an angle of incidence θ is incident on the reflective partitioning walls 135 at an angle of incidence 90°-θ. For total reflection, it is necessary for the angle of incidence 90°-θ to be greater than a critical angle θc for total reflection. In other words, it is necessary to satisfy the following critical condition.

$$90°-\theta > \sin^{-1}(n2/n1)$$

$$n2 < n1 \cos \theta$$

Here, n1 is the refractive index of the first color filter 130R, and n2 is the refractive index of the reflective partitioning walls 135.

The condition may be modified based on an angle $\phi$ determined as described above with reference to FIG. 2B.

Although this case in which the angle of incidence at which the mixed light C1+C3 is incident on the first color filter 130R is θ, it is merely an example. The condition may be obtained by considering an angle of incidence at which the mixed light C1+C3 is incident to the second color filter 130G as θ. When the color separation device 172 separates the incident light into single color light and mixed color light as described above, the mixed light is generally incident to two color filters at the same angle.

When the reflective partitioning walls 135 satisfy the refractive index condition, the mixed light C1+C3 is totally reflected, and thus the mixed light C1+C3 is not incident on the third color filter 130B and is entirely transmitted by the first color filter 130R to the first light detection device 110R. From the mixed light C1+C3, light of the first color C1 may be transmitted through the first color filter 130R and incident on the first light detection device 110R. In other words, of the mixed light C1+C3 incident on the first color filter 130R, light of the first color C1 is incident on the first light detection device 110R without loss and contributes to the generation of electric signals.

The arrow indicated with a dotted line in FIG. 4 indicates a case in which the reflective partitioning walls 135 are not used. The mixed light C1+C3 is incident on the first color filter 130R. Here, since the first color filter 130R is a filter that transmits light of the first color C1 and absorbs lights of other colors, light of the first color C1 is incident on another third color filter 130B adjacent to the color filter 130R. Light of the first color C1 is absorbed by the third color filter 130B.

It is necessary for the light of the first color C1 absorbed by the third color filter 130B to be incident on the first light detection device 110R and to contribute to the acquisition of color information. However, since light of the first color C1 is absorbed by the third color filter 130B, correct color information may not be obtained. Furthermore, the first color filter 130R does not absorb 100% of light of colors other than the light of the first color C1, and some of the light of the third color C3 may be incident on the third light detection device 110B. In this case, light of the third color C3 is incident on the third color filter 130B and sensed thereby, and thus incorrect color information may be obtained.

As described above, the image sensors 101 and 102 employ the color separation devices 170 and 172 to reduce the possibility that light of colors other than those respectively transmitted by the first through third color filters 130R, 130G, and 130B are incident on the first through third color filters 130R, 130G, and 130B. Furthermore, the reflective partitioning walls 135 are employed to prevent light, separated by the color separation devices 170 and 172, from being incident on adjacent color filters even if the lights is incident on one of the first through third color filters 130R, 130G, and 130B at a tilted angle. Therefore, a light utilization efficiency of the image sensors 101 and 102 may be improved. Furthermore, since correct color information may be obtained, color purity may be improved.

Figure 5:
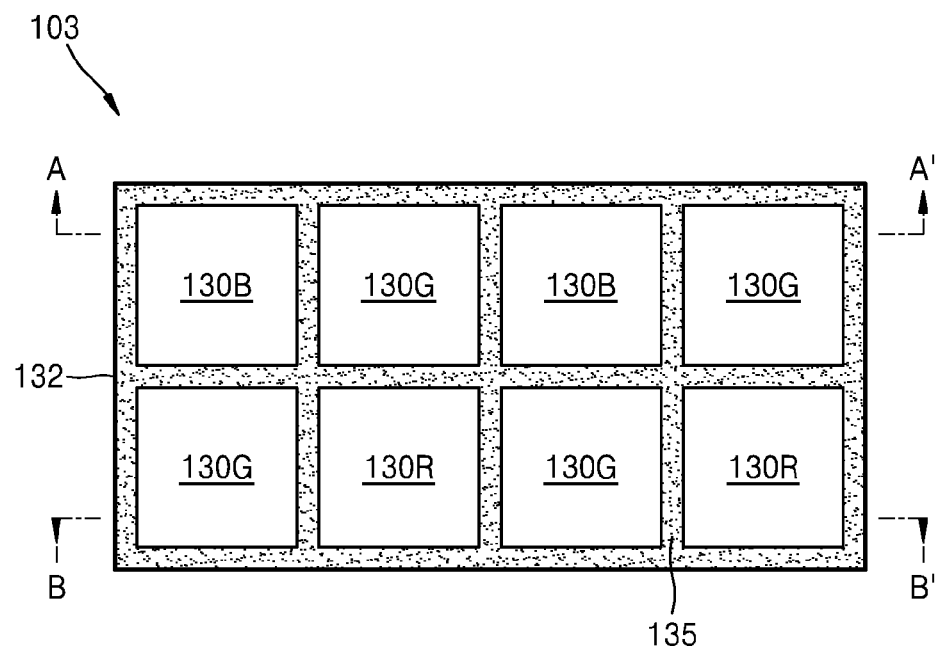
FIG. 5 is a plan view of an image sensor according to another exemplary embodiment.
Figure 6A:
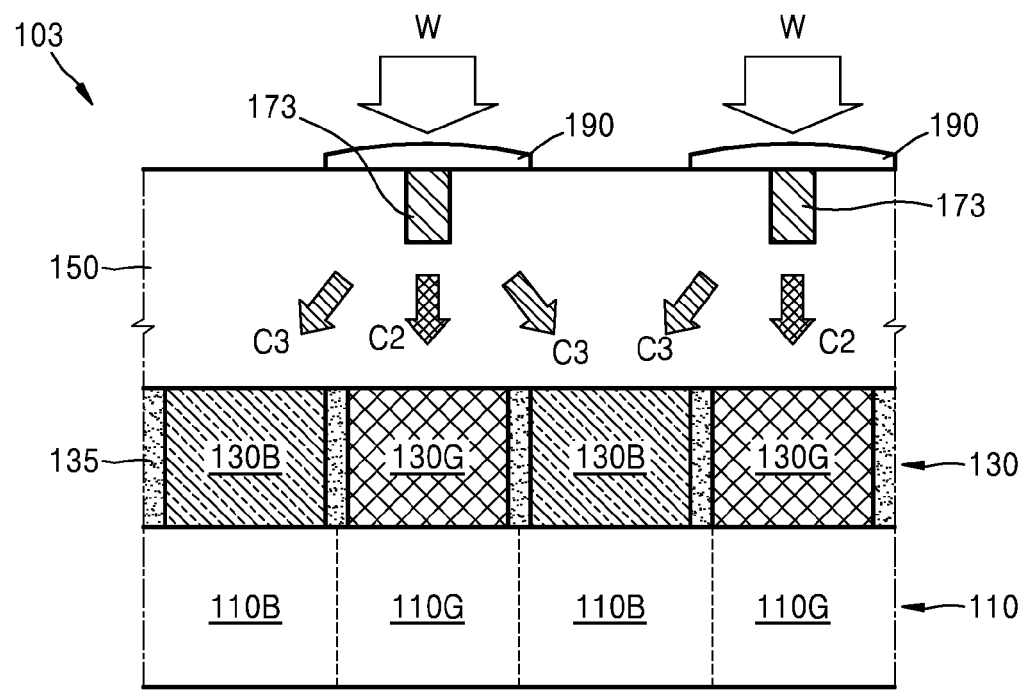
FIGS. 6A and 6B are sectional views taken along line A-A' and line B-B', respectively, of FIG. 5.
Figure 6B:
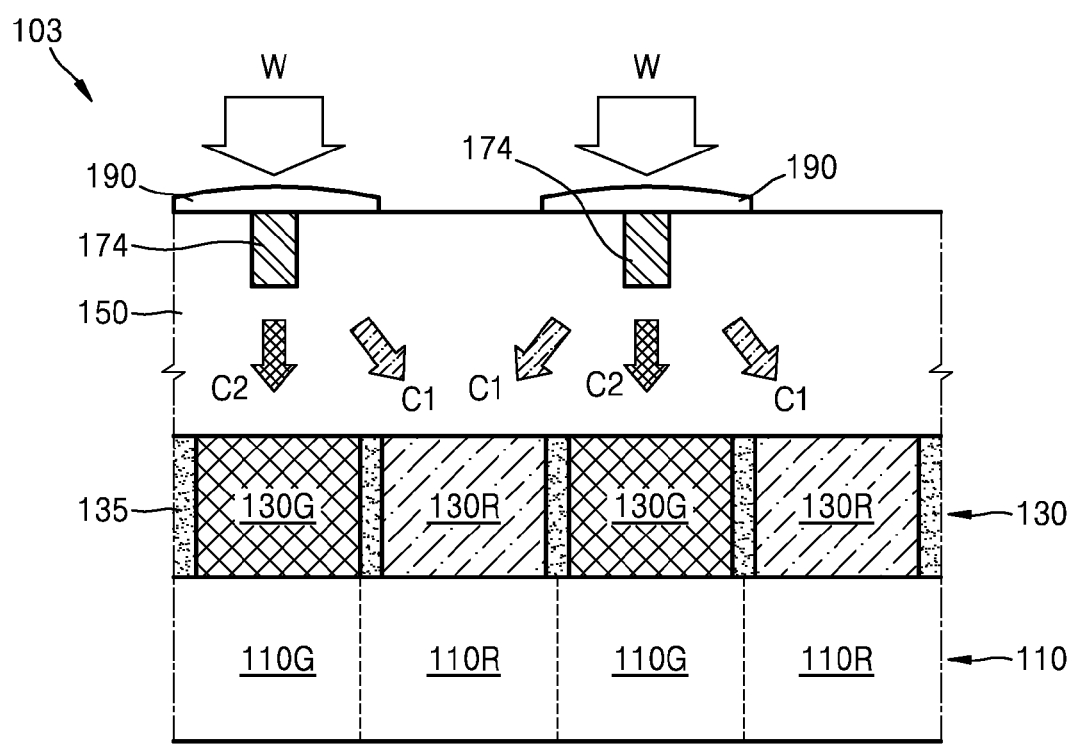

FIG. 5 is a plan view of an image sensor 103 according to another exemplary embodiment, and FIGS. 6A and 6B are sectional views obtained along a line A-A' and a line B-B' of FIG. 5, respectively.

The image sensor 103 according to the present exemplary embodiment is different from the image sensors 101 and 102 according to the previous exemplary embodiments due to the arrangement of the plurality of color filters 130R, 130G, and 130B constituting a color filter array layer 132 and the configurations of color separation devices 173 and 174.

In FIG. 5, for the convenience of showing an arrangement of the color filters 130R, 130G, and 130B, the color separation device is not shown.

Referring to FIGS. 5, 6A, and 6B, the plurality of third color filters 130B and the plurality of second color filters 130G are alternately arranged along a first row in a first direction, and the plurality of second color filter 130G and the plurality of third color filter 130B are alternately arranged along a second row that is parallel to the first row. The first row and the second row are alternately arranged in a second direction, which is perpendicular to the first direction.

FIG. 6A is a sectional view of the first row, whereas FIG. 6B is a sectional view of the second row.

Referring to FIG. 6A, the color separation device 173 is arranged opposite the second color filter 130G of the first row and is configured to diffract or refract light of the third color C3 toward the third color filter 130B and to transmit light of the second color C2 toward the second color filter 130G, without diffraction or refraction.

Referring to FIG. 6B, the color separation device 174 is arranged opposite the second color filter 130G of the second row and is configured to transmit light of the second color C2 toward the second color filter 130G without diffraction or refraction and to diffract or refract light of the first color C1 toward the first color filter 130R.

The reflective partitioning walls 135 are arranged to define the first through third color filters 130R, 130G, and 130B, as described above, where the color separation device 173 and the color separation device 174 may be buried and fixed within the transparent spacer layer 150. A micro-lens 190 may be further arranged to concentrate incident light onto the color separation device 173 and the color separation device 174.

According to a modified exemplary embodiment, the color separation device 173 and the color separation device 174 may have the same color separation function. that is, the color separation device 173 and the color separation device 174 may be configured to transmit light of the second color C2 toward the second color filter 130G without diffraction or refraction and to diffract or refract mixed light C1+C3 toward the first color filter 130R and the third color filter 130B.

Figure 7:
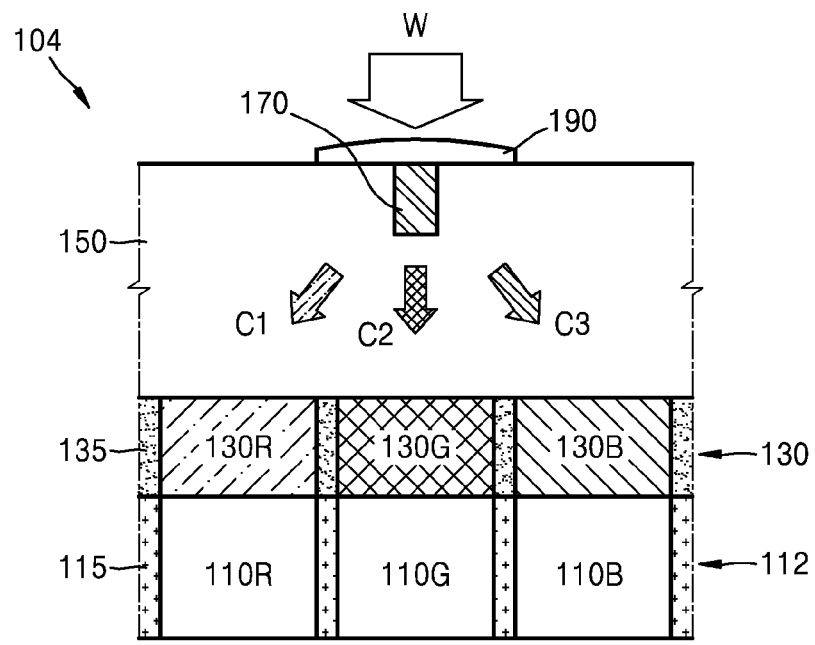
FIG. 7 is a schematic sectional view showing the structure of an image sensor according to another exemplary embodiment.

FIG. 7 is a schematic sectional view showing the structure of an image sensor 104 according to another exemplary embodiment.

Configuration of the image sensor 104 according to the present exemplary embodiment is identical to that of the image sensor 101 according to the exemplary embodiment shown in FIG. 1, except that the sensor substrate 112 further includes partitioning walls 115 defining the plurality of light detection devices 110R, 110G, and 110B.

The partitioning walls 115 prevent light, incident on the color filters 130R, 130G, and 130B at titled angles, from being incident onto the light detection devices 110R, 110G, and 110B at titled angles and being transmitted toward other adjacent light detection devices. To this end, the partitioning walls 115 may be formed of a material that absorbs or reflects light. The partitioning walls 115 may be formed of a material having a refractive index lower than that of a material constituting the light detection devices 110R, 110G, and 110B, where any of various materials used for forming the reflective partitioning walls 135 may also be used. Furthermore, the partitioning walls 115 may be formed to have a double-layer structure. For example, outer portions of the partitioning walls 115 directly contacting the light detection devices 110R, 110G, and 110B may be formed of a silicon oxide, whereas inner portions of the partitioning walls 115 may be formed of poly-silicon. Thickness of the partitioning walls 115 may be identical to or greater than thicknesses of the reflective partitioning walls 135.

The sensor substrate 112 having the structure as described above may be used not only with the image sensor 101 of FIG. 1, but also with the image sensor 102 of FIG. 3 and the image sensor 103 of FIG. 5.

Figure 8:
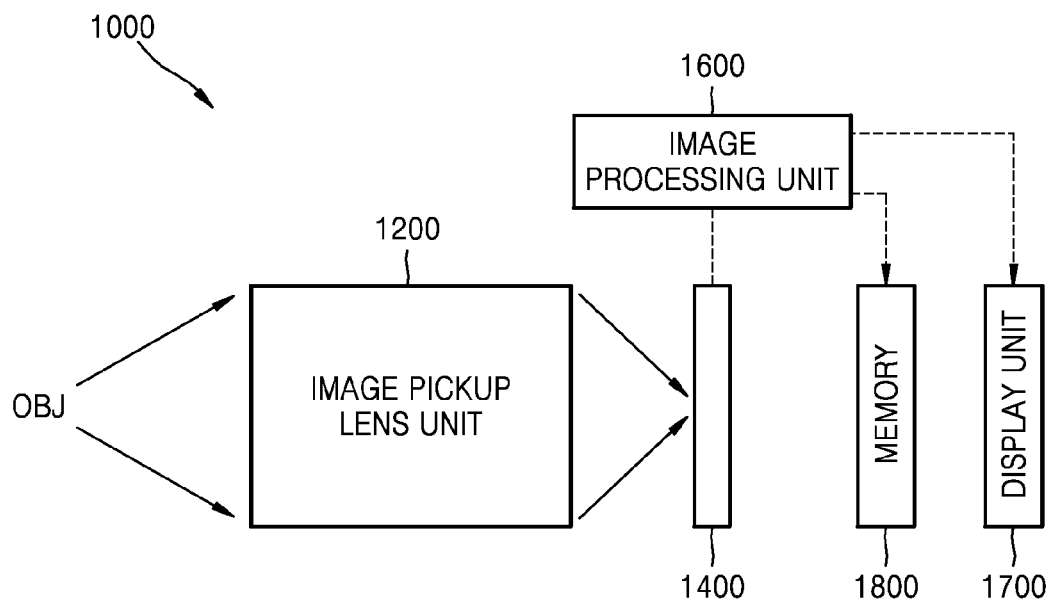
FIG. 8 is a schematic block diagram showing the structure of an image pickup apparatus according to an exemplary embodiment.

FIG. 8 is a schematic block diagram showing the structure of an image pickup apparatus 1000 according to an exemplary embodiment.

The image pickup apparatus 1000 includes an image pickup lens unit 1200, which concentrates light reflected by an object OBJ and forms an optical image, and an image sensor 1400, which converts the optical image formed by the image pickup lens unit 1200 into electric signals.

The image sensor 1400 may be one from among the image sensors 101, 102, 103, and 104 described according to exemplary embodiments or any combination thereof.

Furthermore, the image pickup apparatus 1000 may further include an image processing unit 1600, which processes electric signals from the image sensor 1400 into image signals, a display unit 1700, which displays an image formed by the image processing unit 1600, and a memory 1800, which stores image data formed by the image processing unit 1600. Additionally, an infrared ray screening filter may be arranged between the image sensor 1400 and the image pickup lens unit 1200.

As described above, the image sensor 1400 includes a color separation device and reflective partitioning walls that define a plurality of color filters and prevent light, separated by the color separation device, from being incident on pixels other than corresponding pixels. Therefore, light utilization efficiency is high and correct color information may be obtained. Furthermore, correct color information may be obtained at edge portions of the image sensor 1400 on which light is incident at titled angles.

FIGS. 9A through 9G are diagrams for describing a method of manufacturing an image sensor according to an exemplary embodiment.

Figure 9A:
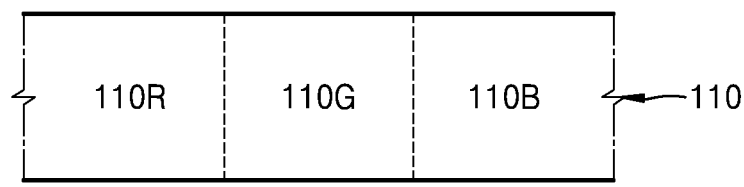
FIGS. 9A through 9H are diagrams illustrating a method of manufacturing an image sensor according to an exemplary embodiment.

Referring to FIG. 9A, the sensor substrate 110 is provided. The plurality of light detection devices 110R, 110G, and 110B, for sensing light, are arranged in an array shape on the sensor substrate 110. The sensor substrate 110 may further include partitioning walls separating the plurality of light detection devices 110R, 110G, and 110B.

Figure 9B:
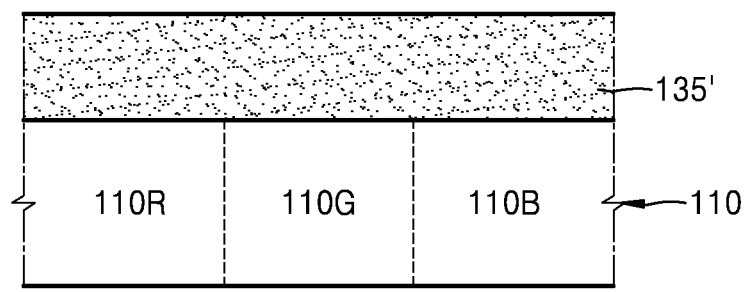

Next, referring to FIG. 9B, a material layer 135', formed of a material for forming reflective partitioning walls, is disposed. The material layer 135' may be formed of a material having a refractive index lower than that of the color filters, defined in a later operation. Furthermore, a refractive index of the material constituting the material layer 135' may satisfy a refractive index condition for total reflection. The material layer 135' may be formed of a material, such as polymethylmetacrylate (PMMA), silicon acrylate, cellulose acetate butyrate (CAB), silicon oxide ($SiO_2$), fluoro-silicon acrylate (FSA), or silicon nitride (SiNx). The material layer 135' is formed on the sensor substrate 110 via a suitable method corresponding to the selected material. For example, a silicon oxide may be formed via plasma enhanced chemical vapor deposition (PECVD). Alternatively, spin-on-glass (SOG) or a similar liquid polymer material may be formed via spin coating. The material layer 135' is formed to have a thickness identical to that of color filters to be formed later.

Figure 9C:
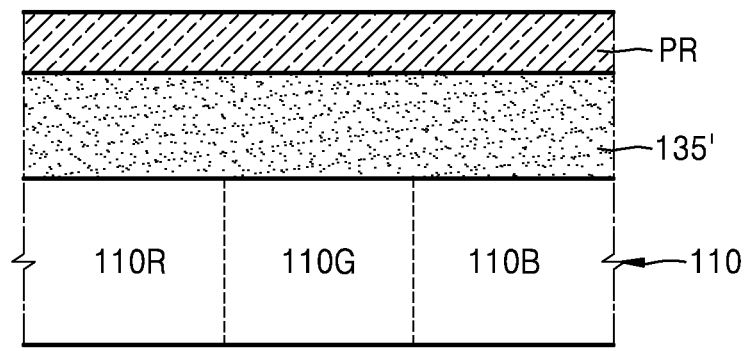

Next, referring to FIG. 9C, a photoresist layer PR is formed to pattern the material layer 135' into the desired shape of the reflective partitioning walls.

Figure 9D:
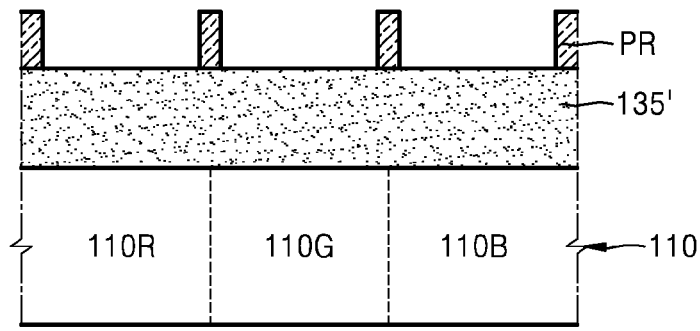

Next, as shown in FIG. 9D, the photoresist layer PR is patterned via photolithography.

Figure 9E:
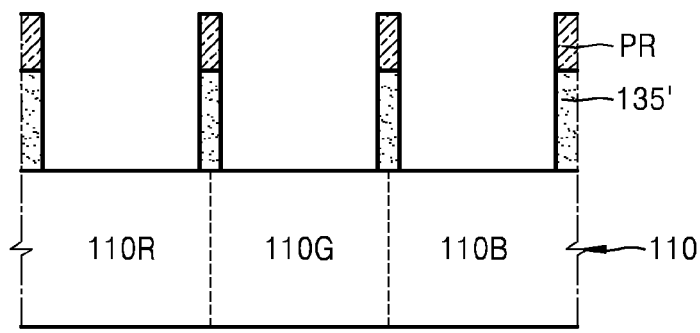
Figure 9F:
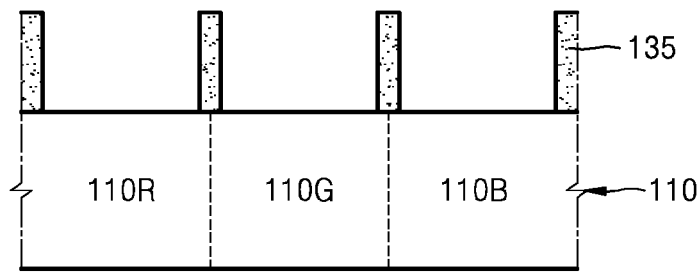

Next, as shown in FIGS. 9E and 9F, the reflective partitioning walls 135 are formed by etching the material layer 135' by using the photoresist layer PR as a mask, and then the photoresist layer PR is removed.

Figure 9G:
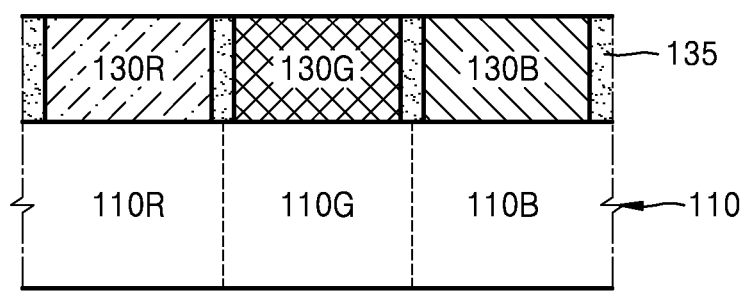

Next, as shown in FIG. 9G, the first color filter 130R, the second color filter 130G, and the third color filter 130B are formed in areas defined by the reflective partitioning walls 135. Arrangement of the first color filter 130R, the second color filter 130G, and the third color filter 130B may be modified to that shown in FIG. 6.

Figure 9H:
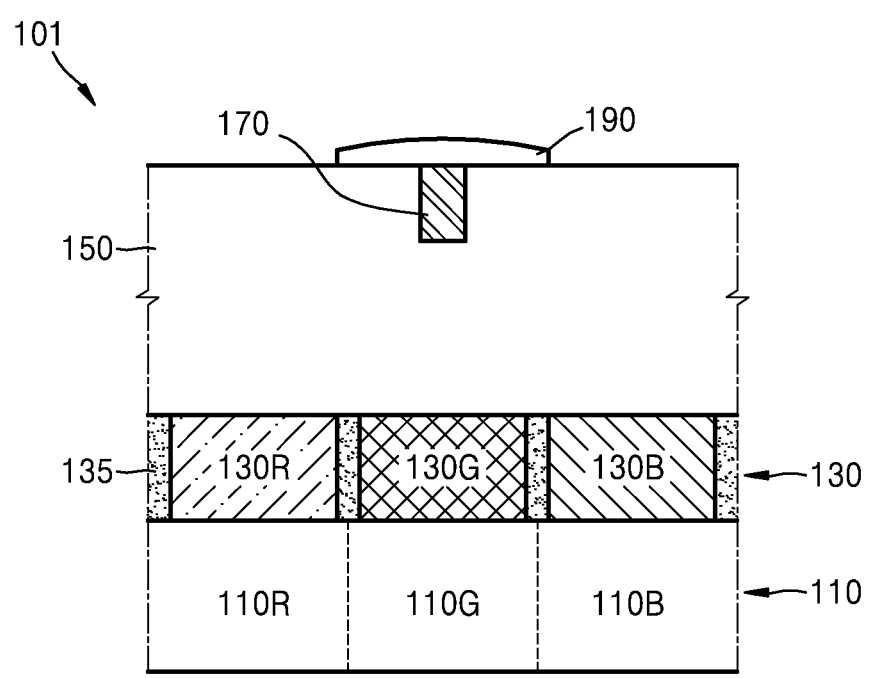

Next, as shown in FIG. 9H, the color separation device 170 is formed on the plurality of color filters. The color separation device 170 is buried and fixed in the transparent spacer layer 150 and may be arranged on the plurality of color filters 130R, 130G, and 130B. Furthermore, the micro-lens 190 for concentrating a light at the color separation device 170 may be further formed.

FIGS. 10A through 10G are diagrams for describing a method of manufacturing an image sensor according to another exemplary embodiment.

Figure 10A:
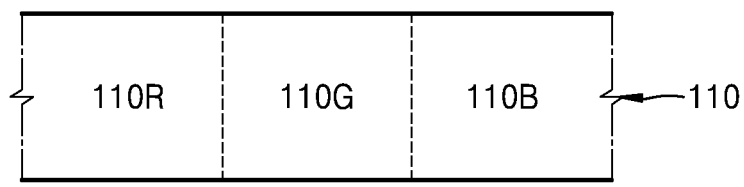
FIGS. 10A through 10H are diagrams illustrating a method of manufacturing an image sensor according to another exemplary embodiment.
Figure 10B:
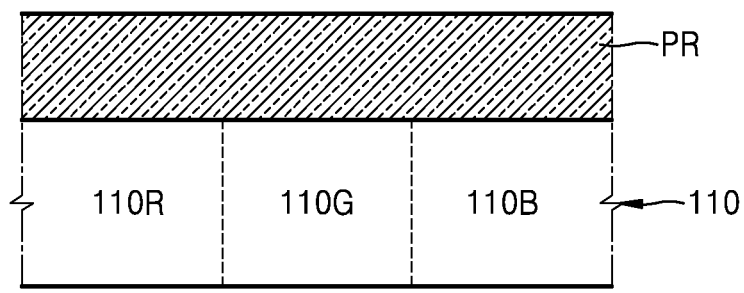

As shown in FIG. 10B, the photoresist layer PR is applied onto the sensor substrate 110, which is provided as shown in FIG. 10A.

Figure 10C:
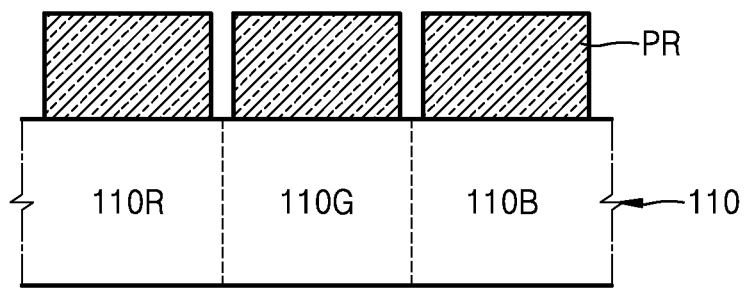

Next, as shown in FIG. 10C, the photoresist layer PR is patterned via photolithography. The patterned photoresist layer PR has an engraved pattern having a shape corresponding to reflective partitioning walls to be formed.

Figure 10D:
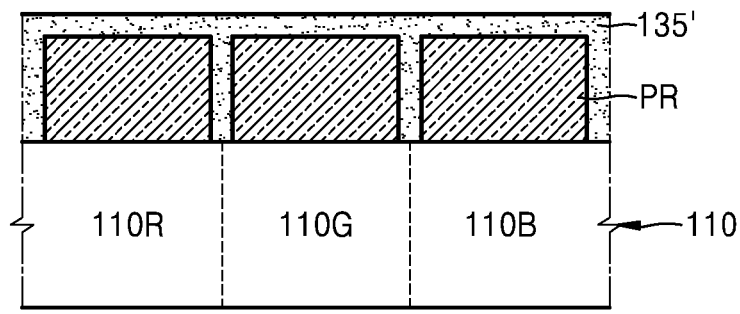

Next, as shown in FIG. 10D, the material layer 135' completely covering the engraved area and the top surface of the photoresist layer PR is formed. Since the material layer 135' is a material which will become the reflective partitioning walls, the material layer 135' may be formed of a material satisfying a desired refractive index condition for total reflection. Furthermore, the material layer 135' is formed via a suitable method corresponding to the selected material. For example, silicon oxide may be formed via plasma enhanced chemical vapor deposition (PECVD). Alternatively, spin-on-glass (SOG) or a similar liquid polymer material may be formed via spin coating.

Figure 10E:
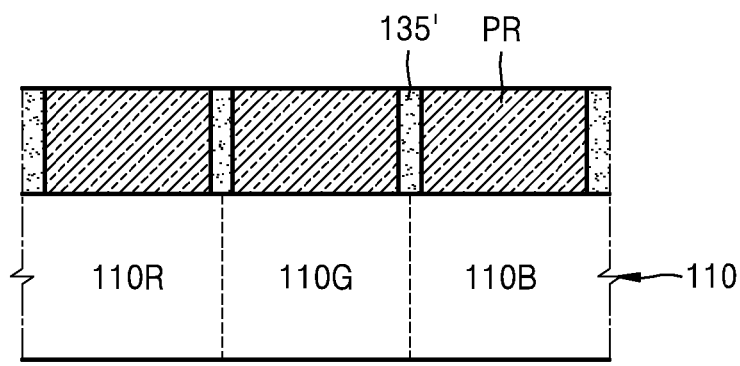
Figure 10F:
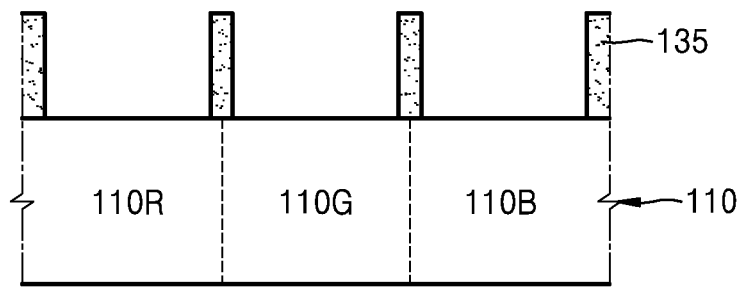

Next, as shown in FIG. 10E, the material layer 135' is etched to expose the top surface of the photoresist layer PR, and then the photoresist layer PR is removed, thereby forming the reflective partitioning walls 135 as shown in FIG. 10F.

Figure 10G:
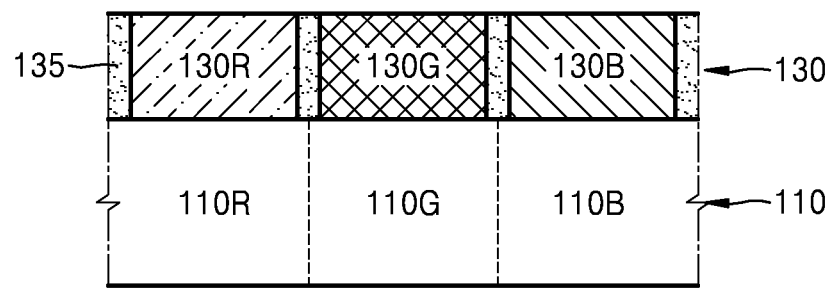

Next, as shown in FIG. 10G, the first color filter 130R, the second color filter 130G, and the third color filter 130B are formed in areas defined by the reflective partitioning walls 135. Arrangement of the first color filter 130R, the second color filter 130G, and the third color filter 130B may be modified to that shown in FIG. 6.

Figure 10H:
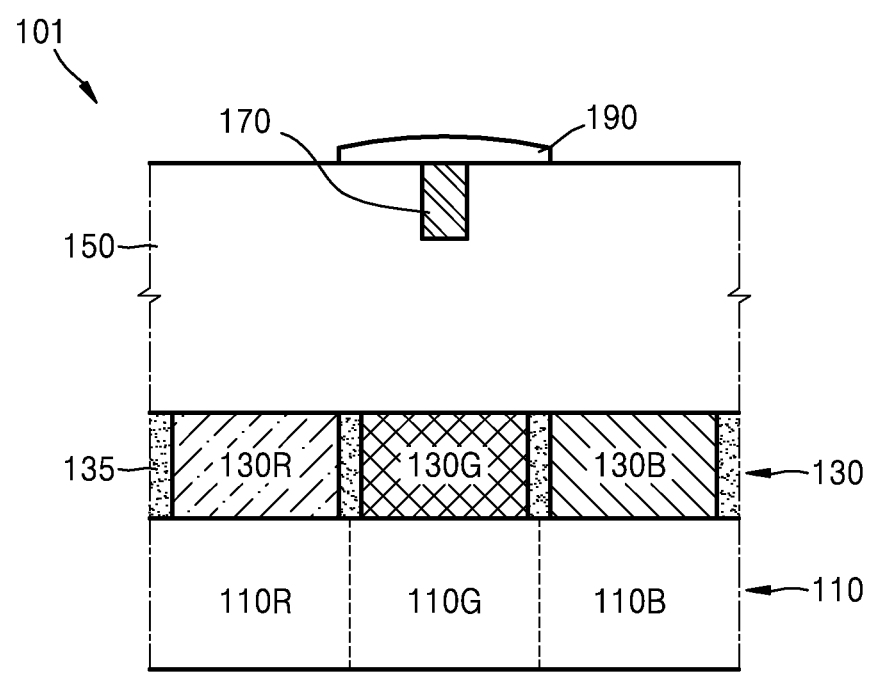

Next, as shown in FIG. 10H, the color separation device 170 is formed on the plurality of color filters. The color separation device 170 is buried and fixed in the transparent spacer layer 150 and may be arranged on the plurality of color filters 130R, 130G, and 130B. Furthermore, the micro-lens 190 for concentrating a light at the color separation device 170 may be further formed.

The image sensor exhibits high light utilization efficiency. Furthermore, the image sensor is capable of obtaining correct color information, thereby exhibiting improved color purity.

The image sensor may be employed by an image pickup apparatus and form a high-quality image.

One or more of these exemplary methods of manufacturing an image sensor may provide an image sensor with high light utilization efficiency and high color purity.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present inventive concept as defined by the following claims.

What is claimed is:
1. An image sensor comprising:
a sensor substrate comprising a plurality of light detection devices arranged in a two-dimensional array;
a color filter array layer disposed on the sensor substrate, the color filter array layer comprising:
a plurality of color filters, which transmit light of a plurality of colors; and reflective partitioning walls, which separate the plurality of color filters, wherein a refractive index of the reflective partitioning walls is lower than a refractive index of the plurality of color filters;
a color separation device, which separates incident light into the plurality of colors and transmits the plurality of colors onto the plurality of color filters.

2. The image sensor of claim 1, wherein, the refractive index of the plurality of color filters is n1, the refractive index of the reflective partitioning walls is n2, and n1 and n2 satisfy the below condition:

$$n2 < n1 \cos \theta,$$

where, θ is a largest angle of incidence at which light of the plurality of colors separated by the color separation device is incident on the plurality of color filters.

3. The image sensor of claim 1, wherein, the refractive index of the color filter is n1, the refractive index of the reflective partitioning walls is n2, and n1 and n2 satisfy the below condition:

$$n2 < n1 \cos \phi,$$

where, φ is a largest angle formed between a line interconnecting a center of a light emission surface of the color separation device and a center of the reflective partitioning walls and a line normal to light emission surfaces of the color filters.

4. The image sensor of claim 1, wherein the reflective partitioning walls are formed of one of polymethylmetacrylate (PMMA), silicon acrylate, cellulose acetate butyrate (CAB), silicon oxide ($SiO_2$), siloxane-based spin-on-glass (SOG), fluoro-silicon acrylate (FSA), and silicon nitride ($SiN_x$).

5. The image sensor of claim 1, further comprising a micro-lens configured to concentrate light onto the color separation device.

6. The image sensor of claim 1, further comprising a transparent spacer layer, which is disposed on the color filter array layer,
wherein the color separation device is disposed within the transparent spacer layer.

7. The image sensor of claim 1, wherein the sensor substrate further comprises partitioning walls, which separate the plurality of light detection devices and wherein the partitioning walls are formed of a material that absorbs or reflects light.

8. The image sensor of claim 1, wherein the plurality of color filters comprises:
a plurality of first color filters, which transmit light of a first color;
a plurality of second color filters, which transmit a light of a second color, different from the first color; and
a plurality of third color filters, which transmit light of a third color, different from the first color and the second color,
wherein the plurality of first color filters, the plurality of second color filters, and the plurality of third color filters are alternately arranged in a two-dimensional array, such that each of the plurality of color filters is adjacent to color filters of different colors.

9. The image sensor of claim 8, wherein the color separation device transmits light of the first color toward the first color filter, transmits light of the second color toward the second color filter, and emits light of the third color toward the third color filter.

10. The image sensor of claim 8, wherein the color separation device transmits light of the second color toward the second color filter and transmits light of both the first color and the third color, toward both the first color filter and the third color filter.

11. The image sensor of claim 10, wherein, a refractive index of the color filter is n1, a refractive index of the reflective partitioning walls is n2, and n1 and n2 satisfy the below condition:

$$n2 < n1 \cos \theta,$$

where, θ is an angle of incidence at which the light of both the mixed light, the first color and the third color, is incident onto the plurality of color filters.

12. The image sensor of claim 10, wherein, a refractive index of the color filter is n1, a refractive index of the reflective partitioning walls is n2, and n1 and n2 satisfy the below condition:

$$n2 < n1 \cos \phi,$$

where, φ is an angle formed between a line interconnecting a center of a light emission surface of the color separation device and a center of the reflective partitioning walls and a line normal to a light emission surface of the plurality of first color filters.

13. The image sensor of claim 8, wherein the color filter layer comprises:
a first row comprising the plurality of second color filters and the plurality of third color filters alternately arranged in a first direction, and
a second row comprising the plurality of first color filters and the plurality of second color filters alternately arranged in the first direction,
wherein the first row and the second row are alternately arranged in a second direction, which is perpendicular to the first direction.

14. The image sensor of claim 13, wherein the color separation device comprises:
a plurality of first color separation devices, which are respectively arranged opposite the plurality of second color filters of the first row, wherein the plurality of first color separation devices transmit light of the third color toward the plurality of third color filters, and transmit light of the second color toward the plurality of second color filters; and
a plurality of second color separation devices, which are respectively arranged opposite the plurality of second color filters of the second row, wherein the plurality of second color separation devices transmit light of the second color toward the plurality of second color filters, and transmit light of the first color toward the plurality of first color filters.

15. The image sensor of claim 13, wherein the color separation device comprises:
a plurality of color separation devices which are respectively arranged opposite the plurality of second color filters of the first row or the second row, wherein the plurality of color separation devices transmit light of the second color toward the plurality of second color filters, and transmit light of both the first color and the third color, toward both the plurality of first color filters and the plurality of third color filters.

16. An image pickup apparatus comprising:
an image pickup lens unit, which is configured to form an optical image from light reflected by an object; and
the image sensor of claim 1, which is configured to convert the optical image formed by the image pickup lens unit into electric signals.

17. A method of manufacturing an image sensor, the method comprising:
- forming reflective partitioning walls on a sensor substrate,
  - wherein the sensor substrate comprises a plurality of light detection devices arranged in a two-dimensional array, and
  - wherein the reflective partitioning walls define a plurality of areas arranged in a two-dimensional array corresponding to the plurality of light detection devices;
- forming a plurality of color filters in the plurality of areas, wherein the plurality of color filters transmit light of a plurality of colors; and
- forming a color separation device, which separates incident light into the plurality of colors and transmits the plurality of colors onto the plurality of color filters, respectively.

18. The method of claim 17, wherein the forming the reflective partitioning walls comprises:
- forming a material layer, having a refractive index lower than a refractive index of the plurality of color filters, on the sensor substrate;
- forming a photoresist layer on the material layer and patterning the photoresist layer into a shape corresponding to desired positions of the reflective partitioning walls; and
- etching the material layer by using the patterned photoresist layer as a mask and removing the patterned photoresist layer.

19. The method of claim 17, wherein the forming the reflective partitioning walls comprises:
- forming a photoresist layer on the sensor substrate and patterning the photoresist layer to engrave a shape corresponding to desired positions of the reflective partitioning walls;
- forming a material layer completely covering an engraved area of the photoresist layer;
- etching the material layer, thereby exposing a top surface of the photoresist layer; and
- removing the photoresist layer.

20. The image sensor of claim 17, wherein the forming the color separation device comprises forming a transparent spacer layer on the plurality of color filters, wherein the color separation device is disposed within the transparent spacer layer.

* * * * *